United States Patent
Takenaka et al.

(10) Patent No.: US 6,528,733 B2
(45) Date of Patent: Mar. 4, 2003

(54) MULTI-LAYER CIRCUIT BOARD AND METHOD OF MANUFACTURING SAME

(75) Inventors: Toshiaki Takenaka, Kyoto (JP); Toshihiro Nishii, Osaka (JP); Shigeru Yamane, Osaka (JP); Shinji Nakamura, Osaka (JP); Hideaki Komoda, Osaka (JP); Kunio Kishimoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/902,800

(22) Filed: Jul. 12, 2001

(65) Prior Publication Data
US 2002/0020548 A1 Feb. 21, 2002

(30) Foreign Application Priority Data

Aug. 17, 2000 (JP) ........................................ 2000-247331

(51) Int. Cl.⁷ ................................................. H05K 1/03
(52) U.S. Cl. ......................... 174/255; 174/254; 29/830; 29/846; 361/749
(58) Field of Search .......................... 29/830, 829, 840; 174/255, 254; 361/748, 749, 750; 427/96

(56) References Cited

U.S. PATENT DOCUMENTS

| 5,461,545 A | * | 10/1995 | Leyroy et al. | .............. 361/750 |
| 5,779,870 A | * | 7/1998 | Seip | .............................. 427/96 |
| 6,392,898 B1 | * | 5/2002 | Asai et al. | ................... 174/255 |

FOREIGN PATENT DOCUMENTS

JP 6-268345 9/1994

* cited by examiner

*Primary Examiner*—Albert W. Paladini
(74) *Attorney, Agent, or Firm*—McDermott, Will & Emery

(57) ABSTRACT

An inner layer circuit board with a convex inner layer circuit pattern having a predetermined thickness, a prepreg sheet having conductive material disposed in a plurality of through-holes and metallic foil are laminated to a substrate, and the laminated board is heated under pressures. After that, a laminated circuit pattern is formed by machining the metallic foil. In such multi-layer circuit board, a smoothing layer is disposed on a concave portion where no inner layer circuit pattern of the inner layer circuit board is formed. In this way, the conductive materials disposed in a plurality of through-holes are uniformly compressed. As a result, the connection resistance between the inner circuit pattern and the laminated circuit pattern becomes stabilized.

29 Claims, 6 Drawing Sheets

MULTI-LAYER CIRCUIT BOARD AND METHOD OF MANUFACTURING SAME

FIELD OF THE INVENTION

The present invention relates to a multi-layer circuit board with at least two or more layers of circuit patterns connected, and a method of manufacturing same.

BACKGROUND OF THE INVENTION

With a recent trend of electronic equipment becoming more miniaturized and higher in component density, there is an increasing demand for multi-layered circuit boards in the fields of both industrial and home-use equipment.

In the field of such multi-layer circuit board, there is a strong demand for the development of a method of making inner via-hole connection between multi-layered circuit patterns, and a circuit board having a highly reliable structure. As a method of manufacturing such circuit board, Japanese Laid-open Patent No. 6-268345 is proposing a method of manufacturing a high density circuit board having a novel structure wherein inner via-hole connections are made by conductive paste. This conventional method of manufacturing a circuit board will be described in the following.

A method of manufacturing a circuit board having four layers as a prior art multi-layer circuit board is described in the following.

First, a method of manufacturing a double-side circuit board being the base for a multi-layer circuit board is described.

FIG. 4 is a sectional view of the process for a conventional method of manufacturing double-side circuit boards for inner layers. In FIG. 4, the substrate is formed of prepreg sheet 21. The prepreg sheet 21 has a shape of 250 mm sq. and about 150 $\mu$m thick. For example, the prepreg sheet 21 is formed of a composite material having non-woven cloth made from aromatic polyamide fiber and thermosetting epoxy resin impregnated to the non-woven fabric. Releasing films 22a, 22b have a plastic film and a Si type releasing agent applied to one side of the film, and the releasing films 22a, 22b are about 16 $\mu$m in thickness. For example, as plastic film, polyethylene terephthalate is employed.

A method of bonding the prepreg 21 and releasing film 22a, 22b together is disclosed in Japanese Laid-open Patent No. 7-106760. Japanese Laid-open Patent No. 7-106760 refers to a method of continuously bonding releasing films 22a, 22b by dissolving the resin component of prepreg 21 with the use of a laminating apparatus.

A through-hole 23 is formed in the pregreg sheet 21 and releasing films 22a, 22b bonded together. The through-hole 23 is filled with conductive paste 24. Metallic foils 25a, 25b such as copper of 18 $\mu$m thick are bonded to either side of the prepreg sheet 21. The conductive paste 24 is electrically connected to the metallic foil 25a, 25b.

In FIG. 4, (a) the releasing films 22a, 22b are bonded to either side of the prepreg sheet 21. Next, (b) the through-holes 23 are formed, at predetermined portions, in the prepreg sheet 21 with the releasing films 22a, 22b bonded thereto, by using a laser beam machining process.

Next, (c) the conductive paste 24 is filled into the through-holes 23. In the method of filling the conductive paste 24, the prepreg sheet 21 having the through-holes 23 is placed on the table of a printer (not shown) and the conductive paste 24 is directly printed on the releasing film 22a. In this case, the releasing films 22a, 22b serve a function as a printing mask and also a function to prevent contamination of the prepreg sheet 21.

Subsequently, (d) the releasing films 22a, 22b are removed from either side of the prepreg sheet 21.

Next, (e) the metallic foils 25a, 25b are laminated to either side of the prepreg sheet 21. And the laminated metallic foils 25a, 25b and prepreg sheet 21 are heated under pressures at a temperature of about 200° C. and pressure of about 4 MPa for one hour in a vacuum.

In this way, (f) the prepreg sheet 21 is compressed and becomes reduced in thickness (t2) to approximately 100 $\mu$m. At the same time, the prepreg sheet 21 and metallic foils 25a, 25b are bonded to each other. Further, the metallic foil 25a disposed on the surface side and the metallic foil 25b disposed on the back side are electrically connected to each other by the conductive paste 24 filled in the through-holes 23 formed at the predetermined positions.

After that, the metallic foils 25a, 25b are selectively etched, and then circuit patterns 31a, 31b are formed respectively on either side thereof. Thus, a double-side circuit board can be obtained.

FIG. 5 is a sectional view of the process for a conventional method of manufacturing a multi-layer circuit board, and the multi-layer circuit board is a four-layer circuit board.

In FIG. 5(a), a double-side circuit board 40 having circuit patterns 31a, 31b manufactured by the steps from (a) to (g) of FIG. 4 and prepreg sheets 21a, 21b with conductive paste 24 filled in through-holes 23 manufactured by the steps from (a) to (d) of FIG. 4 are prepared.

Next, as shown in FIG. 5(b), metallic foil 25b, prepreg sheet 21b, inner layer double-side circuit board 40, prepreg sheet 21a, and metallic foil 25a are positioned and laminated in this order.

Subsequently, the laminated board formed of these is heated under pressures at a temperature of about 200° C. and pressure of about 4 MPa for one hour in a vacuum, thereby curing the prepreg sheets 21a, 21b. Thus, as shown in FIG. 5(c), the prepreg sheets 21a, 21b are compressed and become reduced in thickness (t2) to 100 $\mu$m, then the double-side circuit board 40 and metallic foils 25a, 25b are bonded to each other. The circuit pattern 31a and circuit pattern 31b of the double-side circuit board 40 are connected to the metallic foils 25a, 25b by inner via-holes filled with conductive paste 24. Next, as shown in FIG. 5(d), the metallic foils 25a, 25b are selectively etched, thereby forming the circuit patterns 32a, 32b. In this way, a circuit board having four layers can be obtained.

In the above conventional method of manufacturing a multi-layer circuit board, the double-side circuit boards used for inner layers become decreased in strength and rigidity with decrease in thickness of the circuit boards.

That is, as shown in FIG. 6, circuit pattern 31a is formed on the surface of double-side circuit board 40 where circuit pattern 31b is not formed on the back side of same, and the conductive paste 24 of prepreg sheet 21a is compressed and electrically connected to circuit pattern 32 that is the outermost layer. In this case, due to the pressure applied to the conductive paste 24, the double-side circuit board 40 is deformed by the equivalent to the thickness of circuit pattern 31b on the back side of same and comes in contact with the prepreg sheet 21b.

Accordingly, the conductive paste 24 of conductive paste 24B is less compressed as compared with the conductive paste 24 of conductive paste 24A. As a result, the connection resistance will become unstable.

SUMMARY OF THE INVENTION

A multi-layer circuit board of the present invention comprises:

(a) an inner layer circuit board having an inner layer substrate and an inner layer circuit pattern disposed on at least one surface of the inner layer substrate;

(b) a laminated substrate laminated to the surface of the inner layer circuit pattern; and (c) a laminated circuit pattern disposed on the surface of the laminated substrate, wherein the laminated substrate includes a plurality of laminated through conductors;

the laminated circuit pattern is electrically connected to the inner layer circuit pattern by the plurality of laminated through conductors;

the inner layer circuit board further includes a smoothing layer;

the inner layer circuit pattern is convex in shape, having a predetermined thickness;

the smoothing layer is disposed on a concave portion of the inner layer substrate where the inner layer circuit pattern is not formed; and the laminated substrate is laminated to the smoothing layer and the inner circuit pattern.

By the above configuration, the connection resistance between respective circuit patterns can be stabilized.

A method of manufacturing a multi-layer circuit board of the present invention comprises:

(a) a step of preparing an inner layer circuit board, wherein the inner layer circuit board includes an inner circuit pattern disposed on the surface of an inner layer substrate, and the inner layer circuit pattern is convex in shape, having a predetermined thickness;

(b) a step of forming a smoothing layer on a concave portion of the inner layer substrate except the inner layer circuit pattern;

(c) a step of preparing a prepreg sheet;

(d) a step of preparing a metallic foil;

(e) a step of laminating the prepreg sheet to the surface of the smoothing layer and the inner layer circuit pattern disposed on the inner layer circuit board and laminating the metallic foil to the surface of the prepreg sheet, where the prepreg sheet includes a conductive material disposed in a plurality of through-holes;

(f) a step of heating under pressures the laminated inner layer circuit board, the prepreg sheet and the metallic foil, whereby the conductive material forms through conductors; and (g) a step of forming a laminated circuit pattern by machining the metallic foil.

By the above configuration, deformation of the inner layer circuit board can be prevented when a laminated substrate is laminated to one or either side of the inner layer circuit board by heating under pressures. Further, deformation of the prepreg sheet which forms the laminated substrate can be prevented. Accordingly, a plurality of through conductors for each of the inner layer circuit board and laminated substrate are formed in same length. As a result, the connection resistance between respective circuit patterns becomes stabilized.

DESCRIPTION OF THE REFERENCE NUMERALS

Figure 1A:
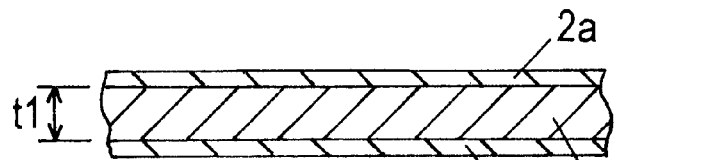
FIG. 1 is a sectional view of the process for a method of manufacturing an inner layer double-side circuit board in an embodiment of the present invention.

1 Inner layer prepreg sheet (first prepreg sheet)
1a First substrate (inner layer substrate)
2a First releasing film
2b Second releasing film
3 Through-hole
4 Conductive paste (conductive material)
4a Inner layer through conductor
4b Through conductor
5a First metallic foil
5b Second metallic foil
6a First circuit pattern (inner layer circuit pattern)
6b Second circuit pattern (inner layer circuit pattern)
6c Fifth circuit pattern (inner layer circuit pattern)
6d Sixth circuit pattern (inner layer circuit pattern)
7 Smoothing layer
7a First smoothing layer
7b Second smoothing layer
8a Third metallic foil
8b Fourth metallic foil
9a Third circuit pattern (laminated circuit pattern)
9b Fourth circuit pattern (laminated circuit pattern)
10a Second prepreg sheet
10b Third prepreg sheet
10c Fourth prepreg sheet
20 Double-side circuit board (inner layer circuit board)
20a First double-side circuit board
20b Second double-side circuit board

DETAILED DESCRIPTION OF THE INVENTION

An inner layer circuit board with a convex inner layer circuit pattern having a predetermined thickness disposed on a substrate, a prepreg sheet with conductive material disposed in a plurality of through-holes, and a metallic foil are laminated to each other, and the laminated board is heated under pressures. After that, a laminated circuit pattern is formed by machining the metallic foil. In such multi-layer circuit board, a smoothing layer is disposed on a concave portion where the inner layer circuit pattern of the inner layer circuit board is not formed. In this way, the conductive materials filled in the plurality of through-holes are uniformly compressed when they are heated under pressures. As a result, the connection resistance between the inner layer circuit pattern and the laminated circuit pattern is stabilized.

A multi-layer circuit board of the present invention comprises:

(a) an inner layer circuit board having an inner layer substrate and an inner layer circuit pattern disposed on at least one surface of the inner layer substrate;

(b) a laminated substrate laminated to the surface of the inner layer circuit pattern; and (c) a laminated circuit pattern disposed on the surface of the laminated substrate, wherein the laminated substrate includes a plurality of laminated through conductors;

the laminated circuit pattern is electrically connected to the inner layer circuit pattern by the laminated through conductors;

the inner layer circuit board further includes a smoothing layer;

the inner layer circuit pattern is convex in shape, having a predetermined thickness;

the smoothing layer is disposed on a concave portion of the inner layer substrate where the inner layer circuit pattern is not formed; and the laminated substrate is laminated to the smoothing layer and the inner circuit pattern.

Thus, there will be no generation of difference in level between the convex and concave portions on the substrate, that is, between the convex inner layer circuit pattern of the inner layer circuit board and the concave portion where the inner layer circuit pattern is not formed. As a result, the connection resistance between the laminated circuit pattern and the inner layer circuit pattern can be stabilized.

Preferably, the inner layer circuit board is a double-side circuit board with through conductors formed in the inner layer substrate;

the inner layer circuit pattern includes a first circuit pattern disposed on one side of the inner layer substrate and a second circuit pattern disposed on the other side of the inner layer substrate;

the first circuit pattern and the second circuit pattern are electrically connected to each other by the through conductors;

the smoothing layer is disposed on concave surfaces of inner layer circuit patterns of both the first circuit pattern and the second circuit pattern;

the laminated substrate includes a second substrate laminated to the first circuit pattern, and a third substrate laminated to the second circuit pattern;

the laminated circuit pattern includes a third circuit pattern disposed on the surface of the second substrate, and a fourth circuit pattern disposed on the surface of the third substrate; and the laminated circuit patterns are electrically connected to the inner layer circuit patterns respectively by the plurality of through conductors.

In this way, the connection resistance between the circuit patterns disposed on either side of the double-side circuit board becomes stabilized. That is, the connection resistance between the first circuit pattern and the second circuit pattern is stabilized. Further, the connection resistance between the laminated circuit pattern and the inner layer circuit pattern is stabilized. That is, the connection resistance between the third circuit pattern and the first circuit pattern becomes stable. Further, the connection resistance between the fourth circuit pattern and the second circuit pattern is stabilized.

Preferably, the smoothing layer has a thickness equivalent to the predetermined thickness of the inner layer circuit pattern.

Thus, even in case the inner layer circuit pattern of the inner layer circuit board is changed in thickness, generation of irregular surfaces can be prevented, and the plurality of through conductors become equal in length, thereby stabilizing the connection resistance between the inner layer circuit pattern and the laminated circuit pattern.

Preferably, the inner layer substrate is formed by heating and compressing a prepreg sheet having fiber aggregate and resin impregnated to the fiber aggregate.

Preferably, the smoothing layer contains resin, and the resin contained in the smoothing layer is same material as the resin contained in the inner layer substrate.

By this configuration, the adhesion properties between each substrate and respective circuit patterns are improved, and further, the heat resistance and physical strength of the multi-layer circuit board may be improved.

Preferably, the resin contains thermosetting resin.

Preferably, the laminated circuit pattern is electrically connected to the inner layer circuit pattern by the through conductors.

Preferably, the through conductor is made from conductive paste filled in through-holes formed in the laminated substrate.

Preferably, the laminated substrate includes a second through conductor penetrating the second substrate and a third through conductor penetrating the third substrate;

the first circuit pattern is electrically connected to the second circuit pattern by the inner layer through conductor;

the third circuit pattern is electrically connected to the first circuit pattern by the second through conductor; and the fourth circuit pattern is electrically connected to the second circuit pattern by the third through conductor.

Preferably, the inner layer circuit board includes a plurality of inner layer circuit boards;

each inner layer circuit board of the plurality of inner layer circuit boards is a double-side circuit board having the inner layer circuit pattern;

each of the inner layer circuit patterns includes a first circuit pattern disposed on one side of the inner layer substrate, and a second circuit pattern disposed on the other side of the inner substrate;

the smoothing layer is disposed on the concave portions of inner layer circuit patterns of both the first circuit pattern and the second circuit pattern;

the laminated substrate includes a plurality of laminated substrates; and each of the laminated substrates is arranged between the respective double-side circuit boards.

Preferably, the inner layer circuit boards include a first inner layer circuit board and a second inner layer circuit board;

each inner layer circuit board of the first inner layer circuit board and the second inner layer circuit board is a double-side circuit board having the inner layer circuit pattern;

each of the inner layer circuit patterns includes a first circuit pattern disposed on one side of the inner layer substrate and a second circuit pattern disposed on the other side of the inner layer substrate;

the smoothing layer is disposed on the concave portions of inner layer circuit patterns of both the first circuit pattern and the second circuit pattern;

the laminated substrates include a second laminated substrate, a third laminated substrate and a fourth laminated substrate;

the third laminated substrate is arranged between the first inner layer circuit board and the second inner layer circuit board;

the second laminated substrate is laminated to the first circuit pattern;

the fourth laminated substrate is laminated to the second circuit pattern; and the laminated circuit patterns include a third circuit pattern disposed on the surface of the second laminated substrate, and a fourth circuit pattern disposed on the surface of the fourth laminated substrate.

Preferably, at least one of the inner layer substrate and the laminated substrate is formed of a prepreg sheet feasible to be compressed under pressures.

Preferably, the fiber aggregate includes at least one of woven and non-woven cloth using aromatic polyamide as main material; and the resin contains thermosetting epoxy resin.

By the configuration described above, small diameter through-holes can be easily formed by a laser beam machining process or the like, and multi-layer circuit boards having excellent physical strength and high circuit capacity can be realized.

Preferably, the fiber aggregate includes a fiber using at least one of glass fiber and ceramic fiber as a main material, and the resin contains thermosetting epoxy resin.

By this configuration, a multi-layer circuit board ensuring high physical strength, excellent environmental characteristics, and high heat resistance can be realized.

Preferably, the laminated circuit pattern includes a plurality of through conductors electrically connected to the inner layer circuit pattern, and all of the through conductors are identical with each other in length and connection resistance.

A method of manufacturing a multi-layer circuit board of the present invention comprises:

(a) a step of preparing an inner layer circuit board, wherein the inner layer circuit board includes an inner circuit pattern disposed on the surface of an inner layer substrate, and the inner layer circuit pattern is convex in shape, having a predetermined thickness;

(b) a step of forming a smoothing layer on a concave surface of the inner layer substrate except the inner layer circuit pattern;

(c) a step of preparing a prepreg sheet;

(d) a step of preparing a metallic foil;

(e) a step of laminating the prepreg sheet to the surface of the smoothing layer and the inner layer circuit pattern disposed on the inner layer circuit board and laminating the metallic foil to the surface of the prepreg sheet, where the prepreg sheet includes a conductive material disposed in through-holes;

(f) a step of heating under pressures the laminated inner layer circuit board, the prepreg sheet and the metallic foil, whereby the conductive material forms through conductors; and (g) a step of forming a laminated circuit pattern by machining the metallic foil.

In the above configuration, the convex inner layer circuit pattern has a predetermined thickness, and a smoothing layer is formed on the substrate where the convex circuit pattern is not formed. Accordingly, the uniformity of heat and pressure application is enhanced, and the conductive paste is uniformly compressed. As a result, the connection resistance between the inner layer circuit pattern and the laminated circuit pattern becomes stabilized.

Preferably, the process of forming the smoothing layer includes:

(1) a step of applying thermosetting resin to the concave portion, and (2) a step of half-curing the thermosetting resin applied.

By this configuration, the layer-to-layer adhesion properties in forming multiple layers will be improved.

Preferably, the process of forming the smoothing layer includes:

(1) a step of covering the inner layer circuit pattern and applying thermosetting resin to the concave portion;

(2) a step of curing the thermosetting resin; and (3) a step of polishing the surface of the cured thermosetting resin to expose the surface of the inner layer circuit pattern.

By this configuration, the inner layer circuit board is improved in strength and rigidity. Accordingly, positioning becomes easier in lamination of multiple layers, and further, there is no generation of resin running and it is possible to prevent deflection of respective circuit pattern positions.

Preferably, the smoothing layer is formed in a manner such that the smoothing layer is same in height as the thickness of the inner layer circuit pattern.

Preferably, the process of forming the inner layer circuit board includes:

(1) a step of forming through-holes in the inner layer substrate;

(2) a step of filling conductive paste into the through-holes;

(3) a step of laminating a metallic foil to either side of the inner layer substrate;

(4) a step of heating under pressures the laminated metallic foil and the inner layer substrate; and (5) a step of forming the inner layer circuit pattern by machining the metallic foil.

By this configuration, the connection resistance between the inner layer circuit pattern and laminated circuit pattern disposed on either side of the inner substrate may be stabilized.

Preferably, the process of preparing the prepreg sheet includes:

(1) a step of forming through-holes in the prepreg sheet, and (2) a step of filling conductive paste into the through-holes.

Preferably, the process of laminating the prepreg sheet and the metallic foil to the surface of the smoothing layer and the inner layer circuit pattern disposed on the inner layer circuit board includes:

(1) a step of alternately arranging a plurality of inner layer circuit boards and prepreg sheets, and (2) a step of holding the plurality of inner layer circuit boards and the plurality of prepreg sheets while adjusting the relative positions of the plurality of inner layer circuit boards and the plurality of prepreg sheets to the predetermined positions.

By this configuration, a plurality of inner layer circuit boards feasible to be compressed and a plurality of prepreg sheets feasible to be compressed are alternately laminated while being positioned and held. Accordingly, highly multi-layered circuit boards can be easily manufactured. Further, the connection resistance between the circuit patterns is stabilized.

Preferably, the inner layer substrate and the prepreg sheet are feasible to be compressed.

Preferably, the prepreg sheet includes fiber aggregate and resin impregnated to the fiber aggregate, and the prepreg sheet is feasible to be compressed, and in the aforementioned step (f) of heating under pressures the laminated inner layer circuit board, the prepreg sheet and the metallic foil, the prepreg sheet is compressed, then the resin is cured, and thereby, the inner layer circuit board, the prepreg sheet and the metallic foil are integrally bonded together.

Preferably, the fiber aggregate includes at least one of non-woven cloth and woven cloth.

Preferably, the fiber aggregate is made from at least one selected from the group consisting of aromatic polyamide, glass and ceramic.

Preferably, the smoothing layer contains resin.

Preferably, in the aforementioned process (c) of preparing a prepreg sheet, the prepreg sheet includes a plurality of through-holes and conductive material disposed in the plurality of through-holes;

in the aforementioned process (f) of heating under pressures the laminated inner layer circuit board, the prepreg sheet and the metallic foil, the prepreg sheet forms a laminated substrate, and the plurality of conductive materials form a plurality of through conductors; and all of the through conductors are identical with each other in penetration length.

Preferably, in the aforementioned process (c) of preparing a prepreg sheet, the prepreg sheet is feasible to be compressed, and the prepreg sheet includes a plurality of through-holes and conductive material disposed in the plurality of through-holes;

in the aforementioned process (f) of heating under pressures the laminated inner layer circuit board, the prepreg sheet and the metallic foil, the prepreg sheet forms a compressed laminated substrate, and the plurality of conductive materials form a plurality of compressed through conductors; and all of the through conductors are identical with each other in penetration length.

A multi-layer circuit board in an exemplary embodiment of the present invention and a method of manufacturing same will be described in the following with reference to FIGS. 1 to 3.

Exemplary Embodiment 1

FIG. 1 is a sectional view showing the process for a method of manufacturing a multi-layer circuit board in an exemplary embodiment of the present invention. Particularly, it shows the process for manufacturing a double-side circuit board as an inner layer circuit board used for a multi-layer circuit board. FIG. 2 is a sectional view of the process for a method of manufacturing a multi-layer circuit board in an exemplary embodiment of the present invention. The multi-layer circuit board shown in FIG. 2 includes a four-layer circuit pattern.

First, a method of manufacturing a double-side circuit board used as an inner layer of a multi-layer circuit board will be described.

In FIG. 1(a), inner layer prepreg sheet 1 (first prepreg sheet) is manufactured as an inner substrate. The inner layer prepreg sheet 1 is 250 mm square and about 130 $\mu$m in thickness (t1). For example, the inner layer prepreg 1 includes a composite material containing non-woven cloth as fiber aggregate and resin impregnated to the non-woven cloth. As the non-woven cloth, aromatic polyamide fiber is employed. As the resin, thermosetting epoxy resin is employed. Each of a first releasing film 2a and a second releasing film 2b includes a Si type releasing agent applied to one side thereof. The releasing films 2a, 2b are approximately 16 $\mu$m in thickness. For example, polyethylene terephthalate is employed as the releasing films 2a, 2b.

The first releasing film 2a is bonded to one side of the inner layer prepreg sheet 1, and the second releasing film 2b is bonded to the other side of the inner layer prepreg sheet 1. Then, the first releasing film 2a, the second releasing film 2b, and the inner layer prepreg sheet 1 are bonded together by means of a laminating apparatus. In the laminating process using a laminating apparatus, the resin component contained in the inner prepreg sheet 1 is melted, and the molten resin serves a function as adhesive.

Figure 1B:
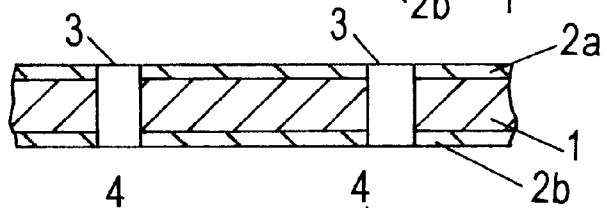

Next, in FIG. 1(b), through-holes 3 are formed in the predetermined portion of the inner layer prepreg sheet 1 with the first releasing film 2a and the second releasing film 2b bonded thereto by using a laser beam machining process.

Figure 1C:
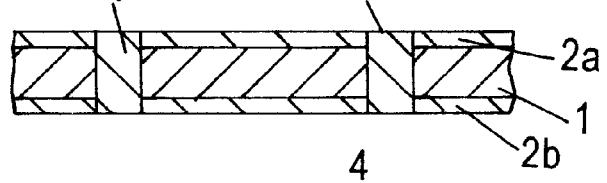

Subsequently, in FIG. 1(c), conductive paste 4 as a conductive material is filled into the through-holes 3. The conductive paste 4 filled in the through-holes 3 forms through conductors. The conductive paste 4 is made from resin component and conductive powder dispersed in the resin component. As the conductive powder, for example, copper powder of 2 $\mu$m in average grain diameter is used. As the resin, for example, solventless thermosetting epoxy resin and acid-anhydride hardening agent are used. A mixture of 85% by weight of conductive powder, 12.5% by weight of thermosetting epoxy resin, and 2.5% by weight of hardening agent is sufficiently kneaded by three rolls to manufacture the conductive paste 4.

The method of filling the conductive paste 4 into the through-holes 3 comprises a step of placing the laminated board of releasing films 2a, 2b and inner layer prepreg sheet 1 having through-holes 3 on the table of a printer (not shown), and a step of directly filling the conductive paste 4 into the through-holes 3 from above the releasing film 2a. Then, the first releasing film 2a and the second releasing film 2b serve a function as a printing mask and also a function to prevent contamination of the inner layer prepreg sheet 1.

Figure 1D:
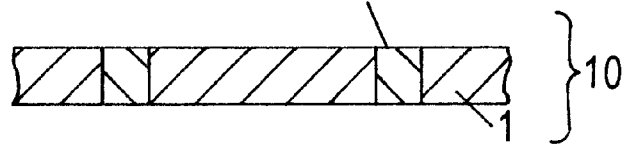

Next, in FIG. 1(d), the first releasing film 2a and the second releasing film 2b are removed from either side of the inner layer prepreg sheet 1.

Figure 1E:
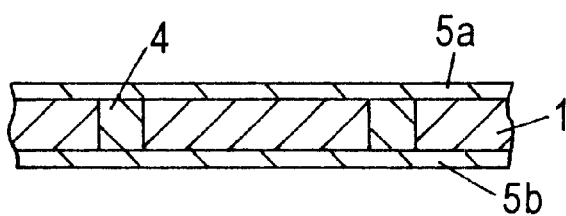

After that, in FIG. 1(e), first metallic foil 5a is laminated to one side of inner layer prepreg sheet 1 having conductive paste filled in through-holes, and second metallic foil 5b is laminated to the other side of the inner layer prepreg sheet 1. The first metallic foil 5a and the second metallic foil 5b are 300 mm square and 18 $\mu$m in thickness.

Figure 1F:
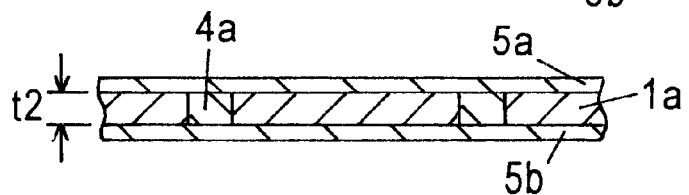

Next, in FIG. 1(f), the laminated first metallic foil 5a, inner prepreg sheet 1 and second metallic foil 5b are heated under pressures at a temperature of about 200° C. and pressure of about 4 MPa for one hour in a vacuum or inactive gas. In this way, the inner layer prepreg sheet 1 is compressed to about 90 $\mu$m in thickness, and also, the inner layer prepreg sheet 1, first metallic foil 5a and second metallic foil 5b are bonded together. Due to the process of heating under pressures, epoxy resin chemically reacts with the curing agent and is cured, and thereby, the inner layer prepreg sheet 1 changes and forms an inner layer substrate 1a.

Further, the conductive paste 4 filled in the through-holes forms inner layer through conductors 4a. In a laminated board of the first metallic foil 5a, inner layer substrate 1a and second metallic foil 5b, thus manufactured, the first metallic foil 5a and the second metallic foil 5b are electrically connected to each other by the inner layer through conductors 4a.

Figure 1G:
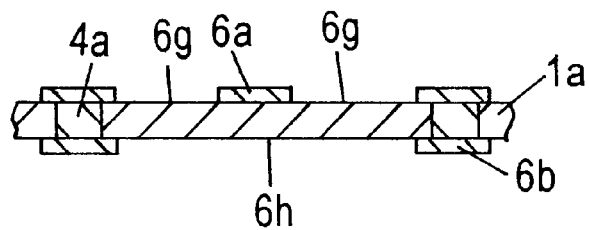

Subsequently, in FIG. 1(g), the first metallic foil 5a is selectively etched, and then a first circuit pattern 6a as an inner layer circuit pattern is formed. Similarly, the second metallic foil 5b is selectively etched, and a second circuit pattern 6b as an inner layer circuit pattern is formed. These circuit patterns 6a, 6b are convex in shape. In this case, a first concave portion 6g and a second concave portion 6h subjected to etching are concave in shape.

Figure 1H:
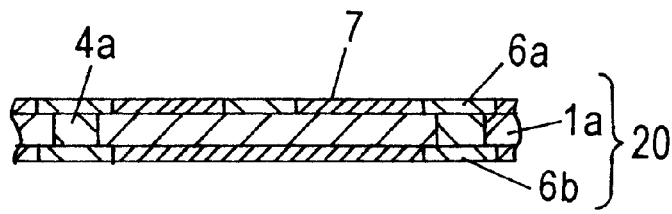

Next, in FIG. 1(h), a first smoothing layer 7a is disposed on the first concave portion 6g where the circuit patterns 6a, 6b are not formed. Similarly, a second smoothing layer 7b is disposed on the second concave portion 6h. The surfaces of the first circuit pattern 6a and the first smoothing layer 7a are same in height. The surfaces of the second circuit pattern 6b and the second smoothing layer 7b are also same in height. Thus, a smoothing layer 7 is formed on the inner layer substrate 1a. In this way, a double-side circuit board 20 can be obtained as an inner layer circuit board.

The method of forming the smoothing layer 7 comprises a step of coating the first concave portion 6c and the second concave portion 6d with a material which contains resin, by using a squeezing method or the like. There is, for example, a material which contains a solvent and resin dissolved in the solvent. In this case, after the concave portions 6g, 6h are coated with the material containing resin, the solvent is evaporated by heating. The type of the resin used is not limited, and for example, thermosetting epoxy resin is used. As the solvent, for example, methyl ethyl ketone or the like is used. In the case of a material containing such methyl ethyl ketone and thermosetting epoxy resin, when heated at a temperature of about 150° C. for about 2 minutes, its solvent component is evaporated, and also, the thermosetting epoxy resin is hardened in a state of stage B. Incidentally, "stage B" stands for a state of being semi-hard.

Also, the smoothing layer 7 is not limited to the smoothing layer 7 in a state of stage B mentioned above, but it is possible to use a smoothing layer described in the following. That is, another method of forming the smoothing layer 7 comprises a step of coating the concave portions 6c, 6d with thermosetting resin component thicker than the circuit patterns 6a, 6b, and a step of forming a thermosetting resin layer by heating the coated thermosetting resin component, and a step of exposing the circuit patterns 6a, 6b by polishing the thermosetting resin layer. The smoothing layer 7 is formed by this method. Here, in the step of coating the concave portions 6g, 6h with the thermosetting resin component, it is also possible to execute a step in which the circuit patterns 6a, 6b are coated with the thermosetting resin component. In this case, the thermosetting resin component coated on the circuit patterns 6a, 6b is removed by polishing or the like. For example, epoxy resin is used as the thermosetting resin component.

The thickness of the smoothing layer 7 formed on either side of double-side circuit board is nearly equal to the thickness of circuit patterns 7a, 7b.

FIG. 2 is a sectional view of the process for a method of manufacturing a multi-layer circuit board in an embodiment of the present invention. A multi-layer circuit board shown in FIG. 2 is an example of a four-layer circuit board having four-layers of circuit patterns.

Figure 2A:
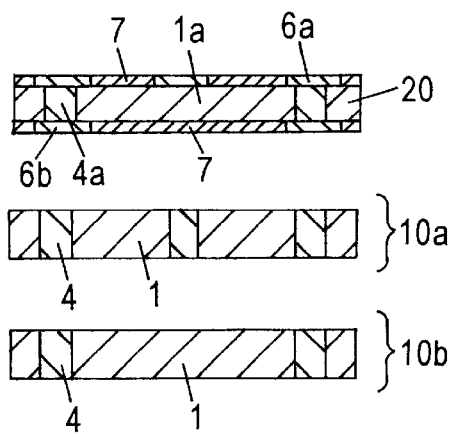
FIG. 2 is a sectional view of the process for a method of manufacturing a multi-layer circuit board in an embodiment of the present invention.

As shown in FIG. 2(a), a double-side circuit board 20 manufactured by the method of FIG. 1 is prepared. The double-side circuit board 20 has smoothing layers 7 formed on concave portions except convex inner layer circuit patterns 6a, 6b. The first circuit pattern 6a as an inner layer circuit pattern is electrically connected to the second circuit pattern 6b by inner layer through conductors 4a disposed in through-holes.

On the other hand, two prepreg sheets 10a, 10b having conductive paste 4 are formed as in the processes (a) through (d) in FIG. 1. The second prepreg sheet 10a has conductive paste 4 filled in through-holes, and the third prepreg sheet 10b also has conductive paste 4 filled in through holes.

Further, third metallic foil 8a and fourth metallic foil 8b are prepared. These metallic foils 8a, 8b are formed of copper and 300 mm square having a thickness of 18 μm.

Figure 2B:
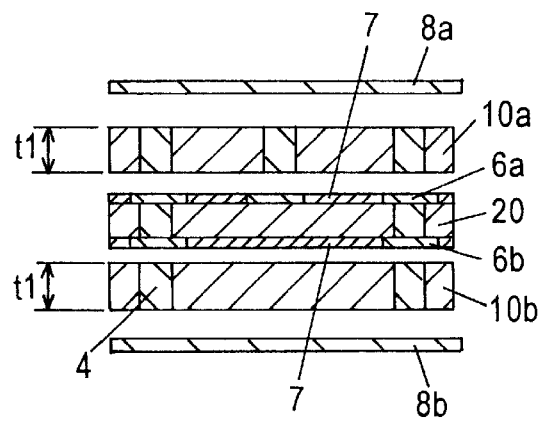

Next, as shown in FIG. 2(b), the fourth metallic foil 8b, third prepreg sheet 10b having conductive paste, double-side circuit board 20, second prepreg sheet 10a having conductive paste, and third metallic foil 8a are positioned and laminated in this order.

Figure 2C:
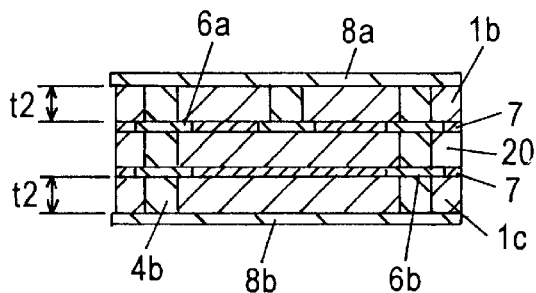

As shown in FIG. 2(c), the laminated material is heated under pressures at a temperature of about 200° C. and pressure of about 4 MPa for one hour in a vacuum or inactive gas. In this way, the two prepreg sheets 10a, 10b are compressed to about 90 μm in thickness (t2), and also, the resin component contained in the prepreg sheets 10a, 10b are cured. As a result, the second prepreg sheet 10a forms a second substrate 1b, and the third prepreg sheet 10b forms a third substrate 1c. Further, the conductive paste 4 filled in the through-holes of prepreg sheets 10a, 10b form through conductors 4b. Further, the double-side circuit board 20 and respective metallic foils. 8a, 8b are bonded to each other. Furthermore, the first circuit pattern 6a makes inner via-hole connection to the third metallic foil 8a by through conductors 4b, and the second circuit pattern 6b makes inner via-hole connection to the fourth metallic foil 8b by through conductors 4b.

Figure 2D:
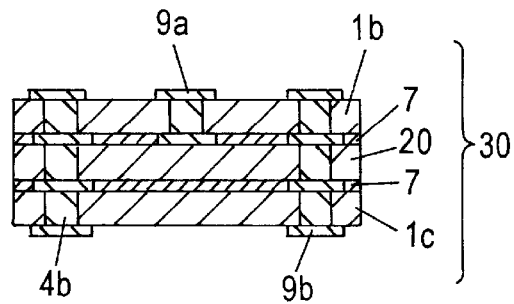

Next, as shown in FIG. 2(d), the third metallic foil 8 and fourth metallic foil 8b are selectively etched, and thereby, third circuit pattern 9a and fourth circuit pattern 9b are formed as laminated circuit patterns.

In this way, a four-layer circuit board 30 having the first circuit pattern 6a, second circuit pattern 6b, third circuit pattern 9a, and fourth circuit pattern 9b can be obtained.

In the method of manufacturing a multi-layer circuit board shown in FIG. 2, a six-layer circuit board can be obtained by using the above four-layer circuit board instead of the double-side circuit board 20.

Further, in the method of manufacturing a multi-layer circuit board shown in FIG. 2, a three-layer circuit board having a three-layer circuit patterns can be obtained by using only the second prepreg sheet 10a without using the third prepreg sheet 10b.

Furthermore, a six-layer circuit board having six-layer circuit patterns can be obtained by using the above four-layer circuit board instead of the double-side circuit board 20.

Thus, a multi-layer circuit board having the required number of circuit patterns can be obtained.

In a multi-layer circuit board manufactured as described above, no deformation of the double-side circuit board was observed. Also, the through conductors formed on respective substrates were same in length. Further, the connection resistance between respective circuit patterns showed the desired value.

By disposing smoothing layers 7a, 7b on respective concave portions 6c, 6d of the first circuit pattern 6a and the second circuit pattern 6b of the double-side circuit board 20, deformation of the double-side circuit board 20 can be prevented when other circuit boards 10a, 10b are laminated by heating under pressures. Further, deformation of other circuit boards 10a, 10b can also be prevented. Accordingly, the conductive materials 4 disposed in respective through-holes are uniformly pressurized to form through conductors 4b being same in length. As a result, the contact resistance between the inner layer circuit pattern and the laminated circuit pattern is stabilized. That is, the connection resistance between the first circuit pattern 6a and the second circuit pattern 6b is stabilized. Further, the contact resistance between the third circuit pattern and the first circuit pattern becomes stable. The fourth circuit pattern and the second circuit pattern becomes stabilized.

Further, since smoothing layers 7a, 7b are disposed on concave portions 6g, 6h of circuit patterns 6a, 6b, all portions of the double-side circuit board 20 become uniform in thickness and smoothness. Accordingly, the pressure will be uniformly applied so that the through conductors 4a disposed in respective through-holes become same in length without causing change in thickness of the first substrate 1a and of the first circuit pattern 6a and the second circuit pattern 6b. As a result, the connection resistance between the circuit patterns is stabilized.

Exemplary Embodiment 2

A method of manufacturing a multi-layer circuit board in another exemplary embodiment of the present invention will be described.

FIG. 3 is a sectional view of the process for a method of manufacturing a multi-layer circuit board in the second exemplary embodiment. The multi-layer circuit board of FIG. 3 has six layers of circuit patterns.

In FIG. 3, a second double-side circuit board 20a and third double-side circuit board 20b are used, which have the same configuration as the double-side circuit board 20 manufactured by the steps (a) through (h) shown in FIG. 1 of the first exemplary embodiment described above.

The second double-side circuit board 20a includes a first circuit pattern 6a and second circuit pattern 6b disposed on either side of a substrate. The second double-side circuit board 20b includes a fifth circuit pattern 6c and sixth circuit pattern 6d disposed on either side of a substrate. Smoothing layer 7 is formed on the concave portions of respective circuit patterns 6a, 6b, 6c, 6d. The respective double-side circuit boards 20a, 20b have through conductors 4a disposed in through-holes. The first circuit pattern 6a and the second circuit pattern 6b are electrically connected to each other by the through conductors 4a. The fifth circuit pattern 6c and the sixth circuit pattern 6d are electrically connected to each other by the through conductors 4a.

Three prepreg sheets are formed, which have the same configuration as the prepreg sheet 10 with through conductors manufactured by the steps (a) through (d) shown in FIG. 1 of the first exemplary embodiment described above. That is, a second prepreg sheet 10a having conductive material 4 disposed in through-holes, a third prepreg sheet 10b having conductive material 4 disposed in through-holes, and a fourth prepreg sheet 10c having conductive material 4 disposed in through-holes are formed in the same way as in the first exemplary embodiment. As the conductive material, conductive paste is used.

Further, third copper foil 8a and fourth copper foil 8b are prepared as the metallic foils to be used. The metallic foils 8a, 8b are 300 mm square and 18 μm in thickness.

Figure 3A:
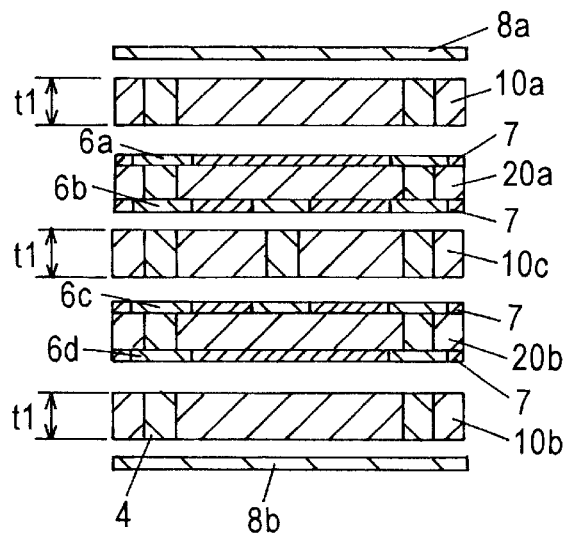
FIG. 3 is a sectional view of the process for a method of manufacturing a multi-layer circuit board in another embodiment of the present invention.

As shown in FIG. 3(a), the fourth metallic foil 8b, fourth prepreg sheet 10c, second double-side circuit board 20b, third prepreg sheet 10b, first double-side circuit board 20a, second prepreg sheet 10a, and third metallic foil 8a are positioned and laminated in this order.

Figure 3B:
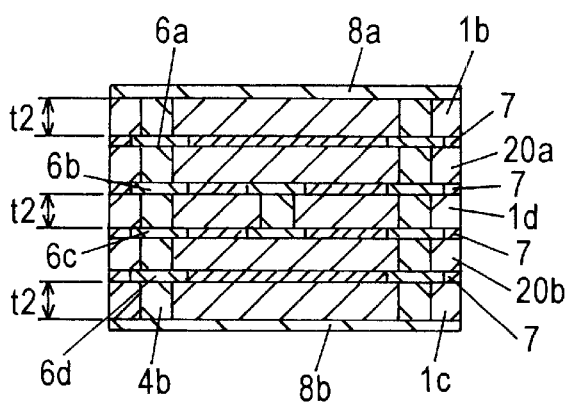

Next, as shown in FIG. 3(b), the laminated board is heated under pressures at a temperature of about 200° C. and pressure of about 4 MPa for one hour in a vacuum or inactive gas. In this way, the resin components of respective prepreg sheets 10a, 10b, and 10c are cured, and simultaneously, the prepreg sheets 10a, 10b, 10c are compressed to about 90 μm in thickness (t2). Further, the prepreg sheets 10a, 10b, 10c, the double-side circuit boards 20a, 20b, and the metallic foils 8a, 8b are respectively bonded to each other. Also, the prepreg sheets 10a, 10b, 10c respectively form substrates 1b, 1c, 1d. At the same time, the conductive paste 4 filled in the through-holes forms through conductors 4b. Thus, the circuit patterns 6a, 6b, 6c, 6d respectively establish inner via-hole connections to the metallic foils 8a, 8b by through conductors 4b.

Figure 3C:
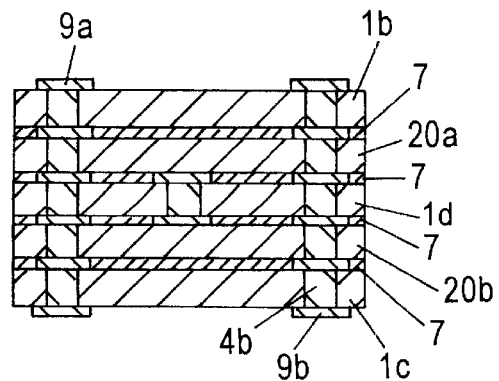
Figure 4A:
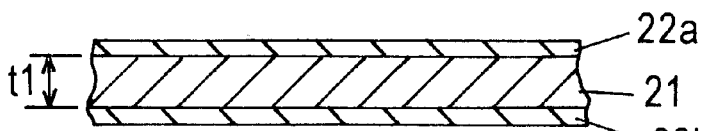
FIG. 4 is a sectional view of the process for a method of manufacturing an inner layer double-side circuit board in a conventional example.
Figure 4B:
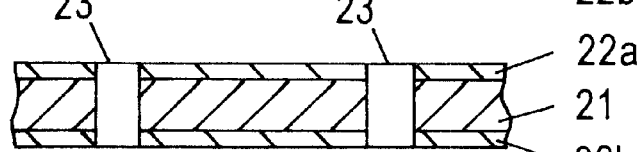
Figure 4C:
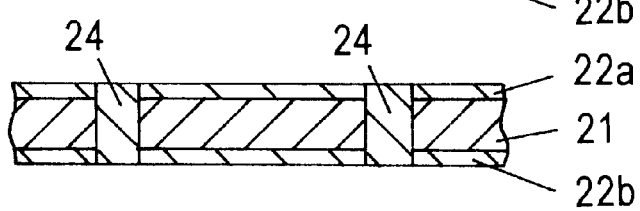
Figure 4D:
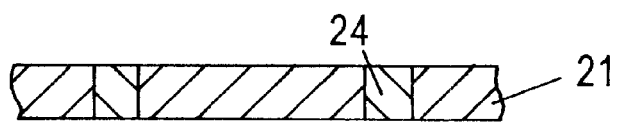
Figure 4E:
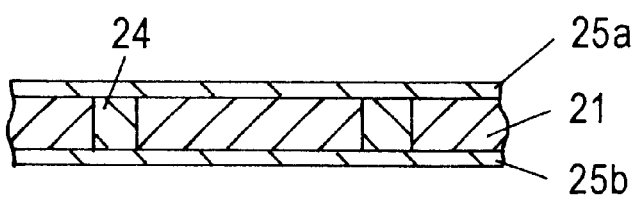
Figure 4F:
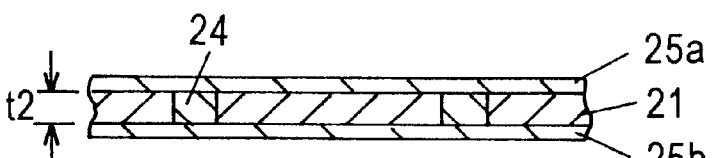
Figure 4G:
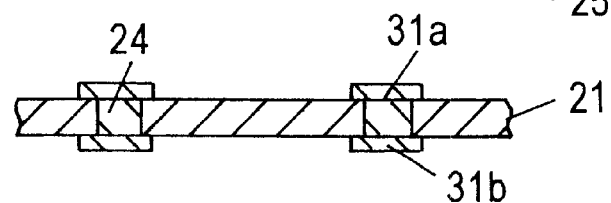
Figures 5A, 5B, 5C, 5D:
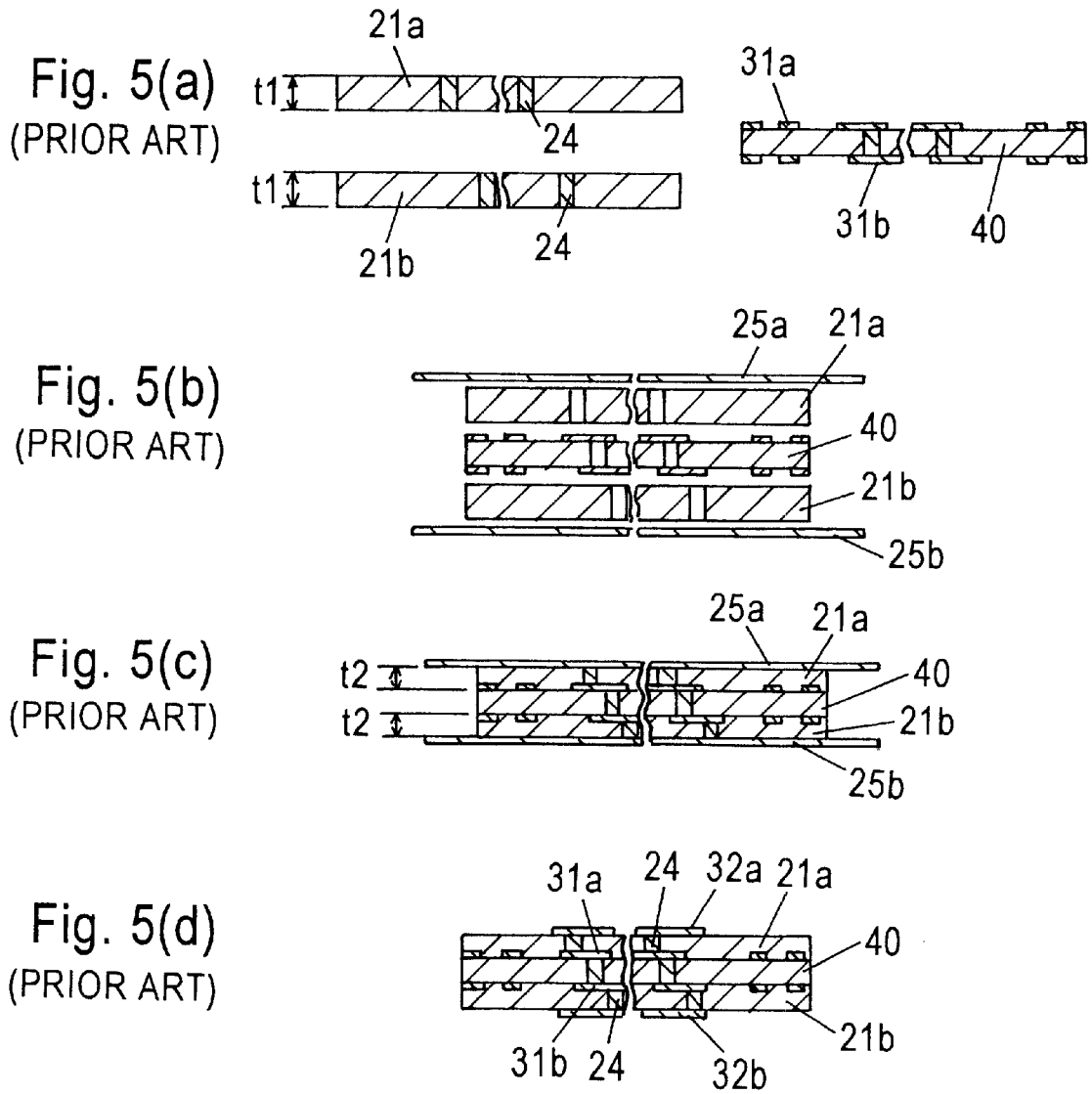
FIG. 5 is a sectional view of the process for a method of manufacturing a multi-layer circuit board in a conventional example.
Figure 6:
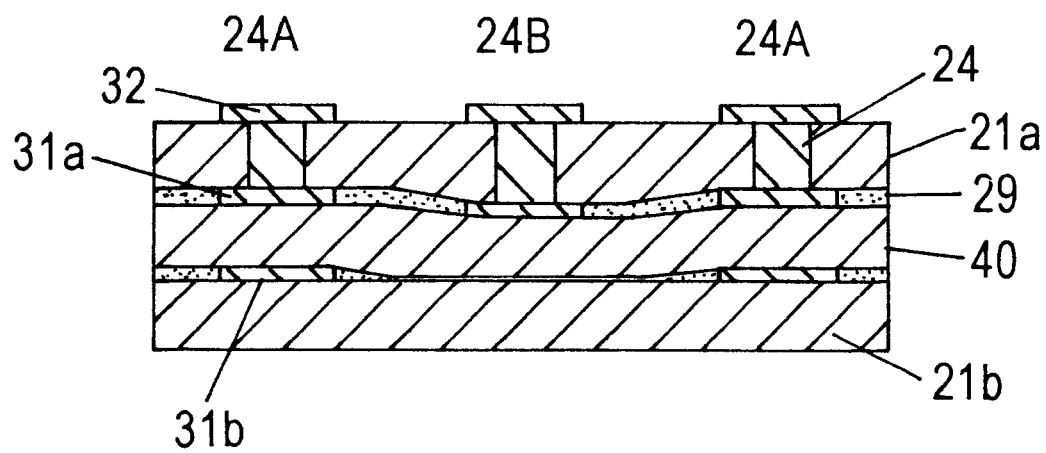
FIG. 6 is a sectional view of a multi-layer circuit board for the description of the problems of the multi-layer circuit board in a conventional example.

Next, as shown in FIG. 3(c), the third metallic foil 8 is selectively etched, and thereby, third circuit pattern 9a is formed as a laminated circuit pattern. Also, the fourth metallic foil 8b is selectively etched, and fourth circuit pattern 9b is formed as a laminated circuit pattern. In this way, a multi-layer circuit board having six layers of circuit patterns can be obtained.

In a multi-layer circuit board manufactured as described above, no deformation of the double-side circuit board was observed. Further, the through conductors 4b formed in the respective substrates were same in length. The inner layer through conductors 4a formed in the substrates were same in length. Further, the connection resistance between the circuit patterns had the desired value. Thus, it has been confirmed that the multi-layer circuit board manufactured by the method of the second exemplary embodiment is also able to bring about the same advantages as in the multi-layer circuit board manufactured by the method of the first embodiment described above.

Exemplary Embodiment 3

In place of the method of manufacturing double-side circuit board 20 in the first exemplary embodiment, it is possible to employ a method of manufacturing a double-side circuit board as described in the following.

That is, in the step (b) of FIG. 1, through-holes 3 are formed by drilling. Also, through conductors precipitated by metal-plating are disposed instead of conductive paste. The other steps are same as in the first exemplary embodiment. That is, smoothing layers 7a, 7b are formed on the concave portions 6g, 6h of respective circuit patterns of the double-side circuit boards used as inner layers.

In the first, second and third exemplary embodiments described above, heat resisting materials such as heat resistant polymer, glass, ceramic and inorganic material are used as fiber aggregate used for prepreg sheets. For example, as a prepreg sheet, it is also possible to use a composite material comprising non-woven glass fiber cloth and thermosetting epoxy resin impregnated in the non-woven glass fiber cloth. Further, instead of aromatic polyamide fiber, ceramic fiber can be used. Also, instead of non-woven cloth, woven cloth can be used. On the other hand, instead of thermosetting epoxy resin, other types of thermosetting resin can be used. In addition, instead of thermosetting epoxy resin, high temperature resisting resin such as polyamide can be used. Thus, there is no particular limits to the materials used for prepreg sheets, and it is possible to use materials according to the desired design conditions. However, the materials used in the first and second exemplary embodiments may bring about most excellent advantages.

Further, in the above first exemplary embodiment, the inner layer circuit patterns include a first circuit pattern 1a and second circuit pattern 1b disposed on either side of substrate 1a. The configuration is not limited to this, but the following configuration is also usable. That is, only a first circuit pattern as an inner layer circuit pattern is disposed on one side of a substrate, and no inner layer circuit pattern is disposed on the other side of the substrate. And, a smoothing layer is disposed on the concave portion of the first circuit pattern. By this configuration, same advantages as described above can be obtained. However, as in the first exemplary embodiment, in the case of a configuration with inner layer circuit patterns disposed on either side of a substrate, the number of steps required for forming a multi-layer circuit board is fewer than required in the case of a configuration with an inner circuit pattern disposed on one side of a substrate.

As is described above, a smoothing layer is formed on the convex portion of the circuit pattern of an inner layer circuit board. Accordingly, in the process of manufacturing a multi-layer circuit board, deformation of the inner layer circuit board can be prevented when a laminated substrate is heated under pressures while being laminated to one or either side of the inner layer circuit board. Further, deformation of the laminated substrate can be prevented. Therefore, a plurality of through conductors disposed in respective through-holes of the inner layer circuit boards and laminated substrates are uniformly pressurized. As a result, the connection reaction between the respective circuit patterns becomes stable. Also, when the inner layer circuit board is a double-side circuit board, disposing smoothing layers on the convex portions of circuit patterns causes the double-side circuit board to become uniform in thickness and smoothness at all portions thereof. And, the through conductors disposed in respective through-holes are uniformly pressurized without changing the thickness of the first substrate, the first circuit pattern and the second circuit pattern. As a result, the connection resistance between the first circuit pattern and the second circuit pattern becomes stabilized, and thereby, a multi-layer circuit board that ensures stable connection resistance may be obtained.

What is claimed is:

1. A multi-layer circuit board, comprising:

(a) an inner layer circuit board having an inner substrate and an inner layer circuit pattern disposed on at least one surface of said inner layer substrate;

(b) a laminated substrate laminated to the surface of said inner layer circuit pattern; and (c) a laminated circuit pattern disposed on the surface of said laminated substrate, wherein said laminated substrate includes a plurality of laminated through conductors;

said laminated circuit pattern is electrically connected to said inner layer circuit pattern by a plurality of said laminated through conductors;

said inner layer circuit board further includes a smoothing layer;

said inner layer circuit pattern is convex in shape, having a predetermined thickness;

said smoothing layer is disposed on a concave portion of said inner layer substrate where said inner layer circuit pattern is not formed; and said laminated substrate is laminated to said smoothing layer and said inner circuit pattern.

2. The multi-layer circuit board of claim 1, wherein said inner layer circuit board is a double-side circuit board having inner layer through conductors formed in said inner layer substrate;

said inner layer circuit pattern includes a first circuit pattern disposed on one side of said inner layer substrate and a second circuit pattern disposed on the other side of said inner layer substrate;

said first circuit pattern and said second circuit pattern are electrically connected to each other by said inner layer through conductors;

said smoothing layer is disposed on concave surfaces of inner layer circuit patterns of both the first circuit pattern and the second circuit pattern;

said laminated substrate includes a second substrate laminated to the first circuit pattern, and a third substrate laminated to the second circuit pattern;

said laminated circuit pattern includes a third circuit pattern disposed on the surface of said second substrate, and a fourth circuit pattern disposed on the surface of said third substrate; and each of said laminated circuit patterns are electrically connected to the inner layer circuit patterns respectively by said plurality of through conductors.

3. The multi-layer circuit board of claim 2, wherein said laminated substrate includes a second through conductor penetrating the second substrate and a third through conductor penetrating the third substrate;

said first circuit pattern is electrically connected to the second circuit pattern by said inner layer through conductor;

said third circuit pattern is electrically connected to the first circuit pattern by said second through conductor; and said fourth circuit pattern is electrically connected to the second circuit pattern by said third through conductor.

4. The multi-layer circuit board of claim 1, wherein said smoothing layer has a thickness equivalent to the predetermined thickness of said inner layer circuit pattern.

5. The multi-layer circuit board of claim 1, wherein said inner layer substrate is formed by heating and compressing a prepreg sheet having fiber aggregate and resin impregnated to said fiber aggregate.

6. The multi-layer circuit board of claim 5, wherein said smoothing layer contains resin, and the resin contained in the smoothing layer is same material as the resin contained in said inner layer substrate.

7. The multi-layer circuit board of claim 6, wherein said resin contains thermosetting resin.

8. The multi-layer circuit board of claim 5, wherein said fiber aggregate includes at least one of woven and non-woven cloth using aromatic polyamide as main material; and said resin contains thermosetting epoxy resin.

9. The multi-layer circuit board of claim 5, wherein said fiber aggregate includes fiber mainly based on at least one of glass fiber and ceramic fiber, and said resin contains thermosetting epoxy resin.

10. The multi-layer circuit board of claim 1, wherein said laminated circuit pattern is electrically connected to the inner layer circuit pattern by said through conductors.

11. The multi-layer circuit board of claim 10, wherein said through conductor is made from conductive paste filled in through-holes formed in said laminated substrate.

12. The multi-layer circuit board of claim 1, wherein said inner layer circuit board includes a plurality of inner layer circuit boards;

each inner layer circuit board of said plurality of inner layer circuit boards is a double-side circuit board having said inner layer circuit pattern;

each of said inner layer circuit patterns includes a first circuit pattern disposed on one side of the inner layer substrate, and a second circuit pattern disposed on the other side of the inner substrate;

said smoothing layer is disposed on concave portions of inner layer circuit patterns of both the first circuit pattern and the second circuit pattern;

said laminated substrate includes a plurality of laminated substrates; and each of said laminated substrates is arranged between the respective double-side circuit boards.

13. The multi-layer circuit board of claim 1, wherein said inner layer circuit boards include a first inner layer circuit board and a second inner layer circuit board;

each inner layer circuit board of the first inner layer circuit board and the second inner layer circuit board is a double-side circuit board having the inner layer circuit pattern;

each of said inner layer circuit patterns includes a first circuit pattern disposed on one side of the inner layer substrate and a second circuit pattern disposed on the other side of the inner layer substrate;

said smoothing layer is disposed on concave portions of inner layer circuit patterns of both the first circuit pattern and the second circuit pattern;

said laminated substrates include a second laminated substrate, a third laminated substrate and a fourth laminated substrate;

said third laminated substrate is arranged between the first inner layer circuit board and the second inner layer circuit board;

said second laminated substrate is laminated to the first circuit pattern;

said fourth laminated substrate is laminated to the second circuit pattern; and said laminated circuit patterns include a third circuit pattern disposed on the surface of said second laminated substrate, and a fourth circuit pattern disposed on the surface of said fourth laminated substrate.

14. The multi-layer circuit board of claim 1, wherein at least one of the inner layer substrate and the laminated substrate is formed of a prepreg sheet feasible to be compressed under pressures.

15. The multi-layer circuit board of claim 1, wherein said laminated circuit pattern includes a plurality of through conductors electrically connected to said inner layer circuit pattern, and all of said through conductors are identical with each other in length and connection resistance.

16. A method of manufacturing a multi-layer circuit board, comprising the steps of:

(a) preparing an inner layer circuit board, wherein said inner layer circuit board includes an inner circuit pattern disposed on the surface of an inner layer substrate, and said inner layer circuit pattern is convex in shape, having a predetermined thickness;

(b) forming a smoothing layer on a concave portion of said inner layer substrate except the inner layer circuit pattern;

(c) preparing a prepreg sheet;

(d) preparing a metallic foil;

(e) laminating said prepreg sheet to the surface of said smoothing layer and said inner layer circuit pattern disposed on the inner layer circuit board and laminating said metallic foil to the surface of said prepreg sheet, where the prepreg sheet includes a conductive material disposed in through-holes;

(f) heating under pressures the laminated inner layer circuit board, the prepreg sheet and the metallic foil, whereby the conductive material forms through conductors; and (g) forming a laminated circuit pattern by machining said metallic foil.

17. The method of manufacturing a multi-layer circuit board of claim 16, wherein the step of forming said smoothing layer includes the steps of:

(1) applying thermosetting resin to the concave portion, and (2) half-curing the thermosetting resin applied.

18. The method of manufacturing a multi-layer circuit board of claim 16, wherein the step of forming said smoothing layer includes the steps of:

(1) covering the inner layer circuit pattern and applying thermosetting resin to the concave portion;

(2) curing the thermosetting resin; and (3) polishing the surface of the cured thermosetting resin to expose the surface of the inner layer circuit pattern.

19. The method of manufacturing a multi-layer circuit board of claim 16, wherein said smoothing layer is formed in a manner such that the smoothing layer is same in height as the thickness of the inner layer circuit pattern.

20. The method of manufacturing a multi-layer circuit board of claim 16, wherein the step of forming said inner layer circuit board includes the steps of:

(1) forming through-holes in said inner layer substrate;

(2) filling conductive paste into said through-holes;

(3) laminating a metallic foil to either side of the inner layer substrate;

(4) heating under pressures the laminated metallic foil and the inner layer substrate; and (5) forming said inner layer circuit pattern by machining the metallic foil.

21. The method of manufacturing a multi-layer circuit board of claim 16, wherein the step of preparing said prepreg sheet includes the steps of:

(1) forming through-holes in said prepreg sheet, and (2) filling conductive paste into said through-holes.

22. The method of manufacturing a multi-layer circuit board of claim 16, wherein the step oflaminating said prepreg sheet and metallic foil to the surface of said smoothing layer and inner layer circuit pattern disposed on said inner layer circuit board includes the steps of:

(3) alternately arranging a plurality of inner layer circuit boards and a plurality of prepreg sheets, and (4) holding said inner layer circuit boards and prepreg sheets while adjusting the relative positions of said inner layer circuit boards and prepreg sheets to predetermined positions.

23. The method of manufacturing a multi-layer circuit board of claim 16,
wherein said inner layer substrate and said prepreg sheet are feasible to be compressed.

24. The method of manufacturing a multi-layer circuit board of claim 16,
wherein said prepreg sheet includes fiber aggregate and resin impregnated to the fiber aggregate, and the prepreg sheet is feasible to be compressed under pressures, and
in the aforementioned step (f) of heating under pressures the laminated inner layer circuit board, prepreg sheet and metallic foil, said prepreg sheet is compressed, then the resin is cured,
thereby, said inner layer circuit board, prepreg sheet and metallic foil are integrally bonded together.

25. The method of manufacturing a multi-layer circuit board of claim 24,
wherein said fiber aggregate includes at least one of non-woven cloth and woven cloth.

26. The method of manufacturing a multi-layer circuit board of claim 24,
wherein said fiber aggregate is made from at least one selected from the group consisting of aromatic polyamide, glass and ceramic.

27. The method of manufacturing a multi-layer circuit board of claim 16,
wherein said smoothing layer contains resin.

28. The method of manufacturing a multi-layer circuit board of claim 16,
wherein the aforementioned process (c) of preparing a prepreg sheet, said prepreg sheet includes a plurality of through-holes and conductive material disposed in said through-holes;
in the aforementioned process (f) of heating under pressures said laminated inner layer circuit board, prepreg sheet and metallic foil, said prepreg sheet forms a laminated substrate, and said conductive materials form a plurality of through conductors; and
all of said through conductors are identical with each other in penetration length.

29. The method of manufacturing a multi-layer circuit board of claim 16,
wherein in the aforementioned process (c) of preparing a prepreg sheet, said prepreg sheet is feasible to be compressed under pressures, and said prepreg sheet includes a plurality of through-holes and conductive material disposed in said through-holes;
in the aforementioned process (f) of heating under pressures said laminated inner layer circuit board, prepreg sheet and metallic foil, said prepreg sheet forms a compressed laminated substrate, and said conductive materials form a plurality of compressed through conductors; and
all of said through conductors are identical with each other in penetration length.

\* \* \* \* \*

UNITED STATES PATENT AND TRADEMARK OFFICE
CERTIFICATE OF CORRECTION

PATENT NO. : 6,528,733 B2  Page 1 of 1
DATED : March 4, 2003
INVENTOR(S) : Toshiaki Takenaka et al.

It is certified that error appears in the above-identified patent and that said Letters Patent is hereby corrected as shown below:

<u>Column 18,</u>
Line 3, change "oflaminating" to -- of laminating --.

Signed and Sealed this

Fifteenth Day of April, 2003

JAMES E. ROGAN
*Director of the United States Patent and Trademark Office*